US008689733B2

(12) United States Patent
Koshimizu et al.

(10) Patent No.: US 8,689,733 B2
(45) Date of Patent: Apr. 8, 2014

(54) PLASMA PROCESSOR

(75) Inventors: Chishio Koshimizu, Nirasaki (JP); Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 12/176,501

(22) Filed: Jul. 21, 2008

(65) Prior Publication Data

US 2008/0277062 A1 Nov. 13, 2008

Related U.S. Application Data

(63) Continuation of application No. 10/477,456, filed as application No. PCT/JP02/04691 on May 15, 2002, now Pat. No. 7,415,940.

(30) Foreign Application Priority Data

May 15, 2001 (JP) ................................. 2001-144938

(51) Int. Cl.
*C23C 16/00* (2006.01)
*C23F 1/00* (2006.01)
*H01L 21/306* (2006.01)

(52) U.S. Cl.
USPC ............. 118/723 E; 156/345.28; 156/345.43; 156/345.44; 156/345.47

(58) Field of Classification Search
USPC ........ 118/723 E; 156/345.28, 345.43–345.47
See application file for complete search history.

(56) References Cited

U.S. PATENT DOCUMENTS

| 4,131,533 | A | * | 12/1978 | Bialko et al. ............. 204/298.14 |
| 4,626,312 | A | * | 12/1986 | Tracy ....................... 156/345.44 |
| 5,273,610 | A | * | 12/1993 | Thomas et al. .......... 156/345.28 |
| 5,288,971 | A | | 2/1994 | Knipp |
| 5,474,648 | A | * | 12/1995 | Patrick et al. .................... 438/10 |
| 5,688,330 | A | | 11/1997 | Ohmi |
| 5,815,047 | A | * | 9/1998 | Sorensen et al. ............. 333/17.3 |
| 5,891,349 | A | * | 4/1999 | Tobe et al. ....................... 216/68 |
| 6,051,073 | A | | 4/2000 | Chu et al. |
| 6,136,388 | A | | 10/2000 | Raoux et al. |
| 6,155,203 | A | * | 12/2000 | Kennedy et al. ............ 118/723 I |
| 6,197,116 | B1 | * | 3/2001 | Kosugi .......................... 118/712 |
| 6,270,618 | B1 | * | 8/2001 | Nakano et al. ........... 156/345.44 |
| 6,303,044 | B1 | * | 10/2001 | Koemtzopoulos et al. ..... 216/59 |
| 6,447,691 | B1 | | 9/2002 | Denda et al. |
| 6,706,138 | B2 | * | 3/2004 | Barnes et al. .............. 156/345.1 |
| 2001/0025691 | A1 | | 10/2001 | Kanno et al. |
| 2001/0050058 | A1 | | 12/2001 | Yamamoto et al. |

FOREIGN PATENT DOCUMENTS

| EP | 0641159 | 3/1995 |
| JP | 05-315098 | 11/1993 |
| JP | 10-321598 | 12/1998 |
| JP | 2001-077035 | 3/2001 |

* cited by examiner

*Primary Examiner* — Rakesh Dhingra
(74) *Attorney, Agent, or Firm* — Crowell & Moring LLP

(57) ABSTRACT

This invention includes a first filter (27) connected between a susceptor (21) and ground and having a variable impedance, a sensor (28) for detecting an electrical signal based on the state of a plasma (P) generated in a process chamber (11), and a control means (36) for controlling the impedance of the first filter (27) on the basis of a detection result output from the sensor (28). Thus, a preferable plasma distribution to match the object of the plasma process can be realized.

19 Claims, 6 Drawing Sheets

PLASMA PROCESSOR

CROSS REFERENCE TO RELATED APPLICATION

This application is a continuing application of U.S. application Ser. No. 10/477,456, filed Nov. 12, 2003, which is a National Phase of PCT/JP2002/004691, filed May 15, 2002 and which claims priority under 35 U.S.C. §119 to Japanese Patent Application No. 2001-144938, filed May 15, 2001, the entire disclosure of which are herein expressly incorporated by reference.

BACKGROUND OF THE INVENTION

The present invention relates to a plasma processing apparatus which performs a predetermined process by generating a plasma.

In the manufacture of a semiconductor device or flat panel display, plasma processing apparatuses are used often to perform processes such as formation of an oxide film, crystal growth of a semiconductor layer, etching, and ashing. A case wherein a plasma processing apparatus is applied to an etching apparatus will be described. FIG. 9 is a view showing an arrangement of an etching apparatus using a conventional plasma processing apparatus.

A susceptor 521 having a support surface for placing a wafer W thereon and an upper electrode 531 parallel to the support surface of the susceptor 521 are arranged in a process chamber 511. The susceptor 521 also serves as a lower electrode.

Exhaust ports 513 for evacuating the interior of the process chamber 511 to a predetermined vacuum degree are formed in the bottom of the process chamber 511, and a gas supply nozzle 514 for supplying process gases into the process chamber 511 is provided to the side wall of the process chamber 511.

The upper electrode 531 is connected to an RF power supply 534, which outputs an RF power of, e.g., 60 MHz, through a matching circuit 535. When the power supply 534 starts supplying the RF power with a frequency of 60 MHz to the upper electrode 531, an electric field with a frequency of 60 MHz is formed in the space between the upper electrode 531 and susceptor 521. This electric field ionizes the gases supplied from the gas supply nozzle 514 to generate a plasma P. The plasma P is utilized for etching the wafer W placed on the support surface of the susceptor 521.

When performing an etching process, the distribution of the plasma P is preferably not distributed in the entire process chamber 511 but distributed over the support surface of the susceptor 521 with a high density. This is because with this distribution, the etching process can be performed efficiently and etching of the inner wall surface of the process chamber 511 by the plasma P can be suppressed, so that the service life of the process chamber 511 can be prolonged.

In view of this, according to this etching apparatus, a filter 527 formed of an LC series resonance circuit is inserted between the susceptor 521 and ground. The resonance frequency of the filter 527 is set to 60 MHz, which is the same as the frequency of the RF power to be supplied to the upper electrode 531. For example, if L=0.07 μH and C=100 pF, the resonance frequency of the filter 527 can be set to 60 MHz. The frequency characteristics of the filter 527 are as indicated by a solid line in FIG. 10, and the impedance is the minimum when the frequency is 60 MHz.

When the plasma P is generated, however, an ion sheath SH is formed between the plasma bulk and the upper electrode 531 or susceptor 521. An electric field is formed in the layer of the ion sheath SH, and accordingly a new capacitance is generated between the upper electrode 531 and susceptor 521 by the generation of the plasma P. For example, assume that a capacitance of 200 pF is generated by the ion sheath SH. Even when the resonance frequency of the filter 527 is designed at 60 MHz as described above, the frequency characteristics of the first path extending from the upper electrode 531 to reach ground through the susceptor 521 and filter 527 are as indicated by a broken line in FIG. 10, and the resonance frequency of the first path becomes 74 MHz. Hence, even if the filter 527 is designed without considering the influence of the ion sheath SH as in the prior art, the frequency of the RF power cannot cause resonance when the plasma P is generated, so the impedance of the first path cannot be decreased sufficiently. Consequently, the plasma P cannot be sufficiently concentrated on the support surface of the susceptor 521.

When process conditions such as the power value of the RF power to be supplied to the upper electrode 531, the pressure in the process chamber 511, the type and mixing ratio of the process gases, and the like are changed, the capacitance obtained by the ion sheath SH described above also changes. Accordingly, even when the filter 527 is designed with a consideration to the influence of the ion sheath SH formed when a plasma is generated under predetermined process conditions, if the process conditions differ from the predetermined process conditions, the frequency (e.g., 60 MHz) of the RF power cannot cause resonance.

When the etching process is to be performed, the plasma P is preferably concentratedly distributed on the support surface of the susceptor 521, as described above. When the interior of the process chamber 511 is to be cleaned, the plasma P is rather preferably diffused in the entire process chamber 511. In this manner, preferable plasma distribution differs depending on the object of the process. Conventionally, the filter 527 is designed for the etching process, and accordingly its characteristics are fixed. Hence, the interior of the process chamber 511 cannot be cleaned under preferable conditions.

When deposits attaching to the inner wall surface or the like of the process chamber 511 peel off during the etching process and form particles, the particles attach to the wafer W to decrease the yield of elements to be formed on the wafer W. Therefore, desirably no deposit preferably attaches at all to the inner wall surface of the like of the process chamber 511, or if any, they desirably attach stably so they will not peel off during the process. The deposit attaching state, however, changes depending on the process conditions as described above. When the process is performed after changing the process condition, the deposit attaching state changes to form particles, which may decrease the yield.

The above problems arise not only when the plasma processing apparatus is applied to an etching apparatus, but are common among plasma processing apparatuses.

SUMMARY OF THE INVENTION

The present invention has been made to solve the above problems, and has as its object to realize a preferable plasma distribution in accordance with the object of the plasma process.

In order to achieve the above object, the present invention is characterized by comprising a first filter connected between ground and a susceptor which is arranged in a process chamber to place a target object thereon, and having variable circuit characteristics, a sensor which detects a state of a plasma generated in the process chamber, and control means for controlling the circuit characteristics of the first filter on the basis of a detection result output from the sensor. Thus, the impedance of the first path, which extends from electric field generating means for generating an AC electric field at a position opposing the support surface of the susceptor to ground through the susceptor and filter, can be adjusted in accordance with the state of the plasma.

In order to perform a process such as etching or CVD, if the plasma distributed over a region opposing the support surface of the susceptor is to be maximized, the control means may control the circuit characteristics of the first filter in such a direction that the impedance of the first path decreases (this mode is called the first control mode). In order to clean the interior of the process chamber, if the plasma is to be diffused in the entire process chamber so the plasma reaching the inner wall surface of the process chamber is maximized, the control means may control the circuit characteristics of the first filter in such a direction that the impedance of the first path increases (this mode is called the second control mode).

When the state of the plasma is detected in this manner and the circuit characteristics of the first filter are controlled on the basis of the detection result, even if a plasma is generated to form an ion sheath or even if the state of the ion sheath changes, a plasma distribution appropriate for a plasma process can be realized without being adversely affected by the ion sheath or its change.

In the case of a parallel-plate plasma processing apparatus, the electric field generating means comprises a counter electrode arranged to be parallel to the support surface of a susceptor, and a power supply for supplying an RF power to the electrode. The sensor suffices as far as it detects, e.g., the value of a current flowing through the first filter, the value of a voltage applied to the first filter, the phase difference between the current and voltage, the value of a current flowing through the counter electrode, the value of the voltage applied to the counter electrode, the phase difference between the current/voltage of the first filter and the current/voltage of the counter electrode, or the like. An output signal from a sensor attached to the wall (excluding the susceptor and counter electrode) or window of the process chamber may be used to control the first filter. Alternatively, output signals from sensors may be used together.

The control means may have a switch that performs switching operation between the first control mode and the second control mode in a multilevel manner or arbitrarily. The two control modes can be realized by the switching operation. Thus, not only a process such as etching but also cleaning can be performed in a preferable state.

The control means may perform switching operation among a plurality of control modes, thus realizing a predetermined plasma distribution corresponding to each of the control modes in the process chamber. Hence, even if the process conditions change and the state of a deposit attaching to the inner wall surface of the process chamber changes, if the amount of plasma reaching the inner wall surface of the process chamber is adjusted in accordance with the changed state, deposits can be suppressed from peeling off to form particles.

The control means may have the function of changing the circuit characteristics of the first filter during a process. For example, the amount of plasma reaching the inner wall surface of the process chamber may be changed periodically, or the amount of plasma reaching the inner wall surface may be changed on the basis of the temperature or the like of the wall of the process chamber. Then, the deposit attaching to the inner wall surface of the process chamber can be stabilized.

When the sensor is of a type that detects the value of a current flowing through the first filter, the control means may control the circuit characteristics of the first filter in such a direction that the value of the current increases if the first control mode is selected, and may control the circuit characteristics of the first filter in such a direction that the value of the current decreases if the second control mode is selected.

When the sensor is of a type that detects the value of a voltage applied to the first filter, the control means may control the circuit characteristics of the first filter in such a direction that the value of the voltage decreases if the first control mode is selected, and may control the circuit characteristics of the first filter in such a direction that the value of the voltage increases if the second control mode is selected.

When the sensor is of a type that detects the number of ions reaching a predetermined region of the inner wall surface of the process chamber, the control means may control the circuit characteristics of the first filter in such a direction that the number of ions decreases if the first control mode is selected, and may control the circuit characteristics of the first filter in such a direction that the number of ions increases if the second control mode is selected.

The control means may control the circuit characteristics of the first filter to match a value obtained by arithmetic process of the detection result output from a single or a plurality of sensors. Then, more appropriate control can be performed than in a case wherein the detection result is directly used for control.

The present invention further may further comprise a power supply connected to the susceptor to apply a bias across the susceptor and the electric field generating means, and a second filter connected between the electric field generating means and ground and having variable circuit characteristics. The control means may control the circuit characteristics of the second filter on the basis of in the detection result output from the sensor. When a bias is applied across the susceptor and electric field generating means, the energy and anisotropy of the plasma can be controlled. At this time, the impedance of the second path extending from the susceptor to ground through the electric field generating means and the second filter can be adjusted in accordance with the state of the plasma. Even if a plasma is generated to form an ion sheath or even if the state of the ion sheath changes, correct control can be performed without being adversely affected by the ion sheath or its change.

The sensor suffices as far as it detects, e.g., the value of a current flowing through the second filter, the value of a voltage applied to the second filter, the phase difference between the current and voltage, the value of a current flowing through the susceptor, the value of the voltage applied to the susceptor, the phase difference between the current/value of the second filter and the current/voltage of the susceptor, or the like. An output signal from a sensor attached to the wall (excluding the susceptor and counter electrode) or window of the process chamber may be used to control the second filter. Alternatively, output signals from sensors may be used together.

When the sensor is of a type that detects the value of a current flowing through the second filter, the control means may control the circuit characteristics of the second filter in such a direction that the value of the current increases.

When the sensor is of a type that detects the value of a voltage applied to the second filter, the control means may control the circuit characteristics of the second filter in such a direction that the value of the voltage decreases.

When the sensor is of a type that detects the number of ions reaching a predetermined region of the inner wall surface of the process chamber, the control means may control the circuit characteristics of the second filter in such a direction that the number of ions decreases.

The control means may control the circuit characteristics of the first and second filters to match a value obtained by arithmetic process of the detection result output from a single or a plurality of sensors. Then, more appropriate control operation can be performed than a case wherein the detection result is directly used for control.

The control means may appropriately control the circuit characteristics of the first filter such that occurrence of abnormal discharge in the process chamber is suppressed. Alternatively, the control means may appropriately control the circuit characteristics of the first and second filters such that occurrence of abnormal discharge in the process chamber is suppressed.

The first filter may be formed to include an inductance of not less than 5 µH or a capacitance of not more than 1,000 pF or. Alternatively, the first and second filters may be formed to include an inductance of not less than 5 µH or a capacitance of not more than 1,000 pF. Then, even when the inductance and capacitance obtained by the ion sheath change in accordance with the process conditions, the impedances of the first and second paths can be adjusted easily in accordance with the state of the plasma by only slightly changing the circuit characteristics of the filters, or even without changing them at all.

The first filter may have a first module for blocking a DC component from passing therethrough, and a second module with a variable circuit constant against a frequency of an AC electric field. When a bias power supply is connected to the susceptor, the first filter may also have a third module for blocking a frequency component of the bias from passing therethrough. In this case, the first filter may have a blocking plate for electrostatically or electromagnetically blocking the first and second modules and the third module from each other.

The second filter may have a first module for blocking a DC component from passing therethrough, a second module with a variable circuit constant against the frequency of the bias, and a third module for blocking the frequency component of the RF electric field from passing therethrough. In this case, the second filter may have a blocking plate for electrostatically or electromagnetically blocking the first and second modules and the third module from each other.

DETAILED DESCRIPTION OF THE EMBODIMENTS

The embodiments of the present invention will be described in detail with reference to the drawings. A case will be described wherein the present invention is applied to an etching apparatus.

First Embodiment

Figure 1:
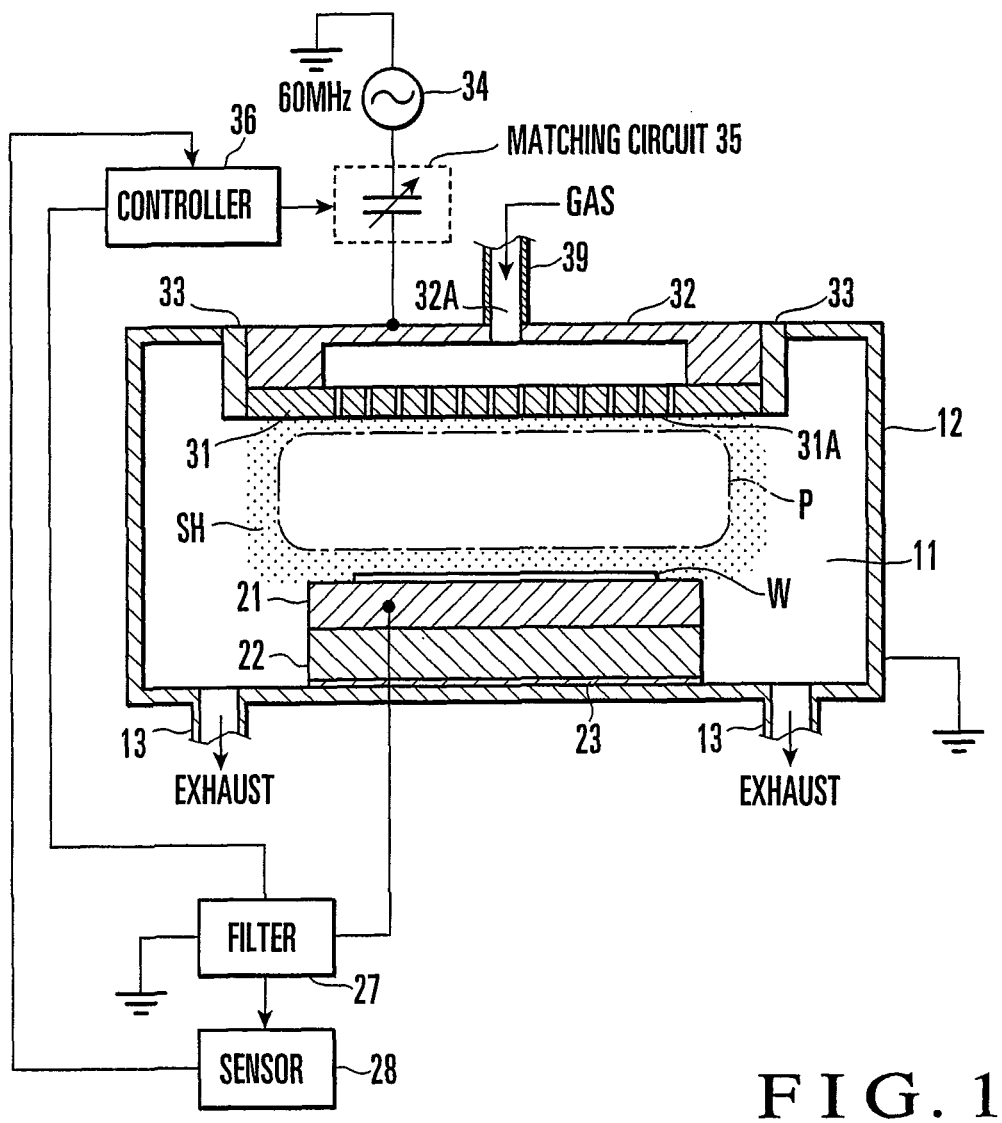
FIG. 1 is a view showing the arrangement of an etching apparatus according to the first embodiment of the present invention.

FIG. 1 is a view showing the arrangement of an etching apparatus according to the first embodiment of the present invention. In FIG. 1, part of the arrangement shows its sectional structure.

A process chamber 11 of this etching apparatus is defined in a hermetically closeable cylindrical process vessel 12. The process vessel 12 is made of a conductive material such as aluminum. Exhaust ports 13 communicating with a vacuum pump (not shown) are formed in the bottom of the process vessel 12, and can set the process chamber 11 to a predetermined vacuum degree.

A support table 22 is provided to the bottom of the process vessel 12 through an insulating plate 23, and a cylindrical columnar susceptor 21 is fixed on the support table 22. The susceptor 21 has a horizontal support surface for placing a wafer (target object) W as an etching target thereon. The susceptor 21 also serves as a lower electrode, and is made of a conductive material such as aluminum.

A circular disk-like upper electrode 31 having a plurality of through holes 31A is arranged in the upper space of the process chamber 11 to be parallel to the support surface of the susceptor 21. The upper electrode 31 is made of a conductive material such as single-crystal silicon, and is fixed to the lower portion of a support 32.

The support 32 is made of a conductive material such as aluminum, and forms a hollow circular column in it to have the upper electrode 31 as its bottom surface. The support 32 is so attached as to close the upper opening of the process vessel 12 through an insulating ring 33. A gas inlet port 32A is formed at the center of the upper surface of the support 32, and is connected to a gas inlet pipe 39. Process gases such as Ar, $O_2$, and the like are introduced from the gas inlet pipe 39.

An RF power supply 34 is connected to the support 32 having the same potential as that of the upper electrode 31. The RF power supply 34 suffices as far as it outputs an RF power with a frequency of about several ten MHz and a power value of about 5 kW. In this embodiment, note that the RF power supply 34 outputs an RF power with a frequency of 60 MHz and a power value of 3.3 kW. A matching circuit 35 is connected between the RF power supply 34 and support 32 to match their impedances. For example, the matching circuit 35 is formed of a variable capacitor, and its capacitance is controlled by a controller 36.

The susceptor 21 is grounded through a first filter 27 formed of a resonance circuit having a variable reactance. The path extending from the upper electrode 31 to reach ground through the susceptor 21 and filter 27 will be called the first path. When the reactance of the filter 27 is changed, the impedance of the first path against the frequency (60 MHz) of the RF power supplied to the upper electrode 31 can be adjusted.

Furthermore, a sensor 28 for detecting an electrical signal flowing through the filter 27 on the basis of the state of a plasma P generated in the process chamber 11, and a controller for controlling the reactance of the filter 27 on the basis of a detection result output from the sensor 28 are provided. In the etching apparatus shown in FIG. 1, the controller 36 for the matching circuit 35 is provided with the function of the control means for the filter 27. Alternatively, a control means for the filter 27 may be provided separately.

The filter 27 will be further described.

Figure 2:
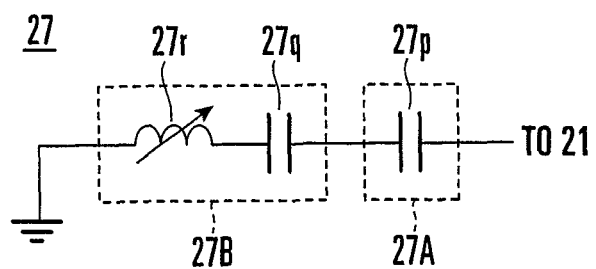
FIG. 2 is a circuit diagram showing the arrangement of a first filter.

FIG. 2 is a circuit diagram showing the arrangement of the filter 27. The filter 27 has a first module 27A for blocking a DC component from passing therethrough, and a second module 27B with a variable reactance against the frequency of the RF power supplied to the upper electrode 31.

When the RF power supply 34 supplies the RF power to the upper electrode 31, a DC voltage of about several hundred V is generated in the susceptor 21. The first module 27A is formed of, e.g., a capacitor 27p, and blocks a DC component from passing from the susceptor 21 to ground, so that short-circuiting of the DC component can be prevented.

The second module 27B is formed of, e.g., a series circuit (LC series resonance circuit) of a coil 27r and capacitor 27q. In this case, it suffices as far as at least one of the inductance of the coil 27r and the capacitance of capacitor 27q is variable. In this embodiment, note that the inductance of the coil 27r is variable, while the capacitance of the capacitor 27q is fixed. When the second module 27B is an LC series resonance circuit as shown in FIG. 2, the capacitor 27q of the second module 27B can also serve as the capacitor 27p of the first module 27A.

The reactance of the filter 27 which is formed of an inductance L (that is, the inductance of the coil 27r) and capacitance C (that is, synthetic capacitance of the capacitors 27p and 27q) is designed by considering an inductance $L_{SH}$ and capacitance $C_{SH}$ obtained by an ion sheath SH and the structures of the process vessel 12 and electrodes (susceptor 21 and upper electrode 31), such that under predetermined process conditions a resonance frequency f1 of the first path is equal to the frequency (60 MHz) of the RF power supplied to the upper electrode 31 and the impedance for this frequency is the minimum. Note that the range of the reactance of the filter 27 is set such that the impedance of the first path can be minimized even when the inductance $L_{SH}$ and capacitance $C_{SH}$ obtained by the ion sheath SH change in accordance with the process conditions, and such that the impedance of the first path can be sufficiently increased when the interior of the process chamber 11 is to be cleaned.

For example, the filter 27 is designed under the following process conditions:

frequency of RF power: 60 MHz, power value: 1.0 kW to 5.0 kW
process pressure: 0.6 Pa to 10 Pa
process gases: Ar=100 sccm to 500 sccm,
$O_2$=5 sccm to 15 sccm
(sccm=standard cubic centimeter per minute)

The capacitance $C_{SH}$ obtained by the ion sheath SH which is formed when the plasma P is generated under these conditions is about 100 pF to 300 pF. The resonance frequency f1 of the first path including the filter 27 is expressed as follows:

$$f1 = 1/\{2\pi(LC_1)^{1/2}\} \quad (1)$$

$$C1 = C \cdot C_{SH}/(C+C_{SH}) \quad (2)$$

Note that C=200 pF and 50 nH≤L≤100 nH are set so that f1=60 MHz is obtained for $C_{SH}$=200 pF.

Alternatively, the filter 27 may be formed by using a fixed inductance L sufficiently larger than the upper limit of the variable range of the inductance $L_{SH}$ obtained by the ion sheath SH or sufficiently smaller than the lower limit of the variable range of the capacitance $C_{SH}$ obtained by the ion sheath SH. In this case, the fixed inductance L is set to 5 μH or more and the fixed capacitance C is set to 1,000 pF or less. Then, the range of the reactance of the filter 27 can be set such that even if the inductance $L_{SH}$ and capacitance $C_{SH}$ of the ion sheath SH change in accordance with the process conditions, the impedance of the first path can be minimized or increased to be sufficiently large without being adversely affected by the changes in inductance $L_{SH}$ and capacitance $C_{SH}$.

Alternatively, the filter 27 may be formed of only the capacitor 27q, and the LC resonance circuit may be formed by utilizing the inductance of an interconnection that connects the susceptor 21 to ground through the filter 27.

The sensor 28 will be further described.

Figure 3:
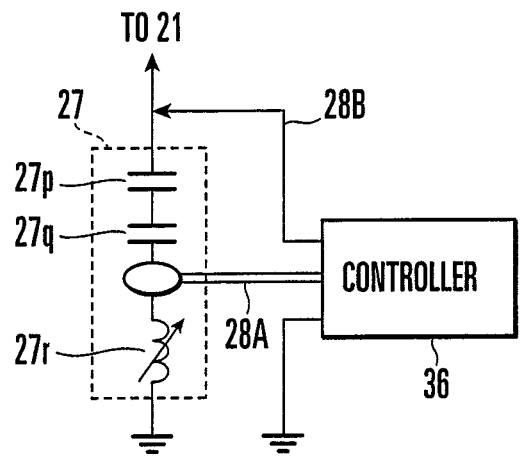
FIG. 3 is a view showing the arrangement of the sensor shown in FIG. 1.

FIG. 3 is a view showing the arrangement of the sensor 28. The sensor 28 is formed of an RF current sensor 28A which detects the value of the current flowing through the filter 27 and outputs it to the controller 36, and an RF voltage sensor 28B which detects the value of the voltage applied to the filter 27 and outputs it to the controller 36.

When filters (not shown) which pass only 60 MHz are inserted on the output sides of the current sensor 28A and voltage sensor 28B, respectively, only the frequency of the RF power supplied to the upper electrode 31 can be detected accurately.

The controller 36 serving as the control means for the filter 27 will be further described.

When the sensor 28 comprises the current sensor 28A and voltage sensor 28B, the controller 36 has the function of obtaining a phase difference between the current and voltage detected by the sensor 28 and calculating the power consumption value of the filter 27, and the function of controlling the reactance of the filter 27 on the basis of the detected current value or voltage value and the calculated power value. Alternatively, an RF equivalent circuit of the process vessel 12 may be stored in the controller 36 in advance, so the controller 36 has the function of calculating a current flowing through the susceptor 21 and the side wall of the process vessel 12 from the output of the filter 27, thus controlling the reactance of the filter 27.

Regarding reactance control of the filter 27, it may be performed alone, or may be performed in combination with capacitance control of the matching circuit 35 in accordance with a predetermined sequence.

The controller 36 has a switch (not shown) that performs switching operation between the first control mode of controlling such that the plasma P distributed over a region opposing the support surface of the susceptor 21 becomes maximum, and the second control mode of controlling such that the plasma P reaching the inner wall surface of the process chamber 11 becomes maximum. The first control mode is selected when performing an etching process. The second control mode is selected when performing cleaning.

When the first control mode is selected, the controller 36 controls the reactance of the filter 27 such that the impedance of the first path against the frequency of the RF power supplied to the upper electrode 31 becomes minimum. For example, the capacitance C of the e filter 27 is controlled such that the value of the current flowing through the filter 27 becomes maximum. When the second control mode is selected, the controller 36 controls the reactance of the filter 27 such that the impedance of the first path against the frequency of the RF power becomes sufficiently large. For example, the capacitance C of the filter 27 is controlled such that the value of the current flowing through the filter 27 becomes sufficiently small.

In this manner, the controller 36 may perform control on the basis of the value itself of the current flowing through the filter 27. More preferably, the controller 36 estimates and controls the total current input to the susceptor 21 by considering the current flowing from the susceptor 21 to other members and circuits such as an insulator (not shown).

The reactance of the filter 27 may be controlled such that the value of the voltage applied to the filter 27 becomes large or small.

As described above, the detection result output from the sensor 28 as the detected current value or voltage value may be directly used for control. Alternatively, a value obtained by applying the detection result to a predetermined model and subjecting it to an arithmetic process may be used for control. The model means an expression for calculating an index indicating the plasma distribution in the process chamber 11 at a given time from, e.g., the value of the current passing through the filter 27. When this model is used, more appropriate control can be performed.

The operation of the etching apparatus shown in FIG. 1 will be described.

The operation during the etching process will be described first.

First, with the wafer W being placed on the support surface of the susceptor 21, the interior of the process chamber 11 is set to a vacuum degree of, e.g., about 2.7 Pa. While maintaining this vacuum degree, Ar and $O_2$ are introduced from the gas inlet pipe 39 to the space between the support 32 and upper electrode 31 at flow rates of 400 sccm. These gases diffuse in the space and are supplied into the process chamber 11 through the plurality of through holes 31A formed in the upper electrode 31. The gases supplied into the process chamber 11 at this time are uniformly discharged to the target surface of the wafer W.

In this state, the RF power supply 34 supplies an RF power with a frequency of 60 MHz and a power value of 3.3 kW to the upper electrode 31. The RF power forms an AC field with a frequency of 60 MHz in the process chamber 11, and flows to ground from the susceptor 21 or process vessel 12. The electric field formed in the process chamber 11 ionizes the gases supplied in the process chamber 11 to generate the plasma P. At this time, the ion sheath SH accompanying an electric field is formed around the plasma P. The ion sheath SH newly generates a capacitance $C_{SH}$ of about 200 pF between the upper electrode 31 and susceptor 21.

When the plasma P stabilizes, the filter 27 detects the value of the current flowing through the filter 27 interposed between the susceptor 21 and ground and the value of the voltage across the filter 27, and outputs them to the controller 36. The controller 36 calculates the value of the power from the detected current value and voltage value. In the controller 36, the first control mode appropriate for the etching process has been selected. Thus, the controller 36 controls the reactance of the filter 27 in such a direction that the detected current value increases, and decreases the impedance of the first path extending from the upper electrode 31 to ground through the susceptor 21 and filter 27.

Figure 4:
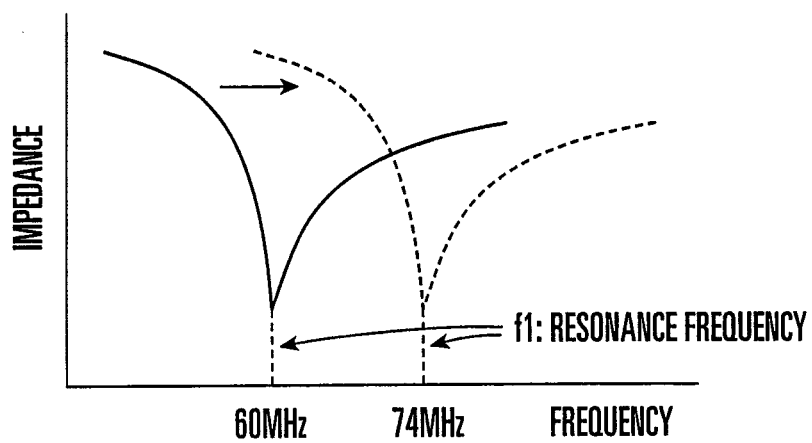
FIG. 4 is a graph showing the frequency characteristics of a first path extending from an upper electrode to reach ground through a susceptor and filter.

FIG. 4 is a graph showing the frequency characteristics of the first path including the filter 27. The solid line indicates the characteristics of the resonance frequency f1 being 60 MHz, and the broken line indicates the characteristics of the resonance frequency f1 being 74 MHz. As is apparent from FIG. 4, the impedance of the first path against 60 MHz becomes minimum when the resonance frequency f1 of the first path is 60 MHz. Accordingly, the capacitance C of the filter 27 is controlled such that the resonance frequency of the first path becomes 60 MHz. When the capacitance C of the filter 27 is 200 pF and a capacitance $C_{SH}$ of about 100 pF to 300 pF is generated due to the influence of the ion sheath SH, the inductance L of the filter 27 is adjusted within a range of almost 50 nH to 110 nH, as is apparent from equations (1) and (2).

Detection with the sensor 28 and control of the filter 27 with the controller 36 on the basis of this detection result may be performed once, and after that the two detection results may be fixed. Alternatively, detection and control may be repeated when necessary.

In this manner, control operation is performed on the basis of the current flowing through the filter 27 such that the impedance of the first path against 60 MHz becomes minimum. Then, of the RF power supplied to the upper electrode 31, its proportion directed to the process vessel 12 decreases as compared to the prior art, and its proportion directed to the susceptor 21 further increases. Hence, the distribution of the plasma P generated by the RF power does not spread in the entire process chamber 11 but is concentrated to the support surface of the susceptor 21. As a result, the etching process of the wafer W utilizing the plasma P can be performed more efficiently than in the prior art. The amount of plasma P reaching the inner wall surface of the process vessel 12 decreases as compared to the prior art. Thus, etching of the inner wall surface of the process vessel 12 by the plasma P is suppressed, so that the service life of the process vessel 12 can be prolonged and formation of the particles can be decreased.

A case wherein etching process is to be performed under different process conditions will be described. For example, the process conditions are changed as follows:

frequency of RF power: 60 MHz, power value: 1.0 kW to 1.5 kW process pressure: 2.7 Pa process gases: Ar=300 sccm to 400 sccm, $O_2$=5 sccm to 20 sccm Under these conditions, a capacitance $C_{SH}$ of about 300 pF to 400 pF is generated by the ion sheath SH. When the inductance L of the filter 27 is adjusted within the range of about 50 nH to 60 nH by the same control as that described above, the resonance frequency of the first path is set to 60 MHz, so that the impedance of the first path against 60 MHz can be minimized. Even when the process conditions are changed and accordingly the state of the ion sheath SH changes, a plasma distribution appropriate for the etching process can be realized without preparing a filter designed to match the process conditions.

Cleaning of the interior of the process chamber 11 will be described. Operations until generation of the plasma P and calculation of the power consumption value of the filter 27 are the same as in the etching process.

When cleaning is to be performed, as the second control mode is selected in the controller 36, the controller 36 controls the reactance of the filter 27 in such a direction that the value of the detected current decreases, thus increasing the impedance of the first path extending from the upper electrode 31 to reach ground through the susceptor 21 and filter 27.

As is apparent from FIG. 4, the impedance of the first path against 60 MHz increases as the resonance frequency f1 of the first path changes from 60 MHz. Accordingly, in this case, the inductance L of the filter 27 is controlled such that the resonance frequency of the first path largely changes from 60

MHz (excitation frequency). The resonance of the first path may alternatively be set at a higher or lower frequency.

In this manner, control is performed on the basis of the current flowing through the filter 27 such that the impedance of the first path against 60 MHz increases. Then, of the RF power supplied to the upper electrode 31, its proportion directed to the susceptor 21 decreases, and its proportion directed to the process vessel 12 increases. Hence, the distribution of the plasma P generated by the RF power spreads in the entire process chamber 11, and the plasma P reaching the inner wall surface of the process chamber 11 increases. Thus, the interior of the process chamber 11 can be cleaned efficiently.

In this manner, the controller 36 can be switched between the two control modes by the switch. Thus, not only the etching process but also cleaning can be performed in a preferable state.

In the etching apparatus shown in FIG. 1, the voltage sensor 28B may detect the value of the voltage applied to only the capacitors 27p and 27q or the coil 27r that form part of the filter 27.

The sensor 28 may be formed of only the current sensor 28A. In this case, the controller 36 controls the reactance of the filter 27 in such a direction that the value of the current flowing through the filter 27 increases or decreases. In this case as well, the controller 36 preferably estimates and controls the total current input to the susceptor 21.

Although the reactance of the filter 27 is variable, it suffices as far as the circuit characteristics of the filter 27 including a resistance are variable.

To minimize the impedance of the first path, a resonance frequency need not be used. It suffices as far as the impedance is minimized as a consequence.

Second Embodiment

Figure 5:
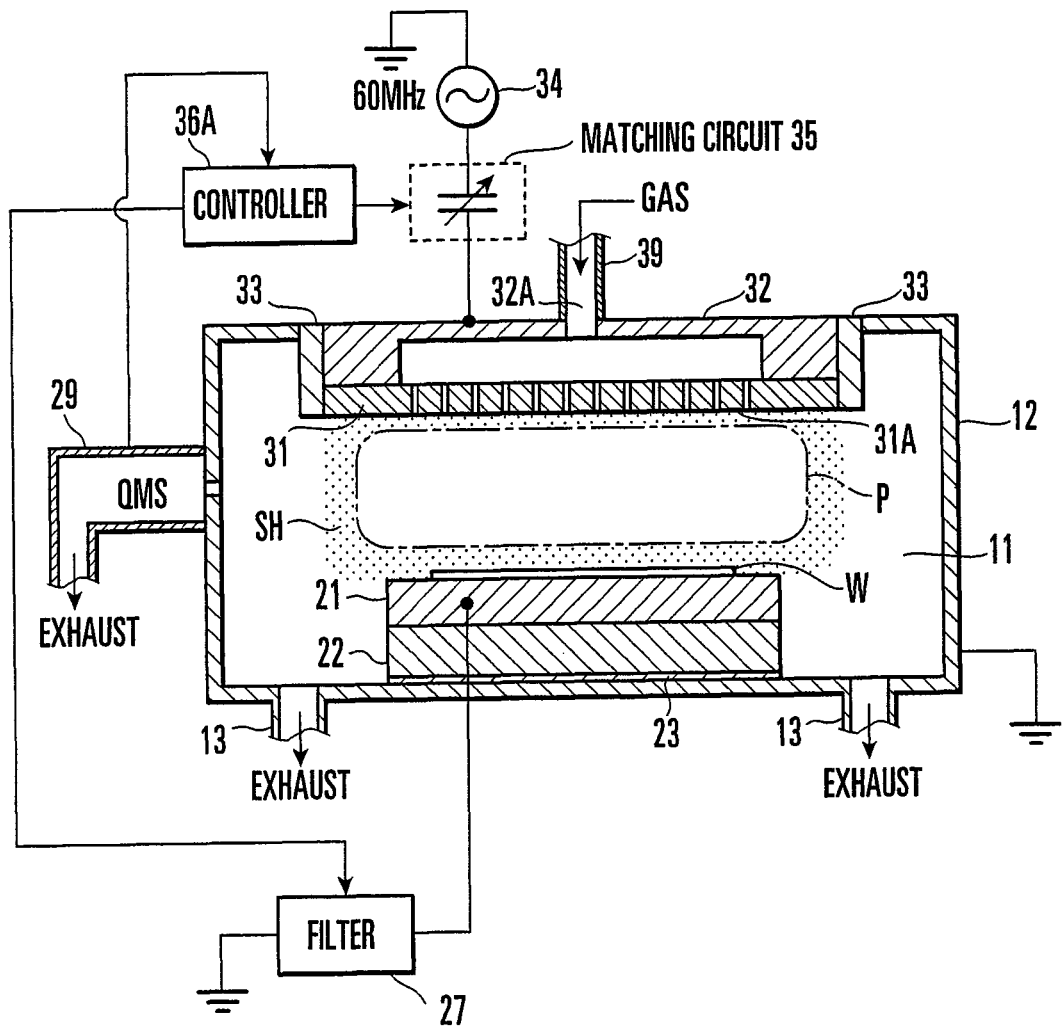
FIG. 5 is a view showing the arrangement of an etching apparatus according to the second embodiment of the present invention.

FIG. 5 is a view showing the arrangement of an etching apparatus according to the second embodiment of the present invention. In FIG. 5, the same portions as in FIG. 1 are denoted by the same reference numerals, and a description thereof will be omitted when appropriate.

The etching apparatus shown in FIG. 5 has a quadrupole mass spectrometer (to be abbreviated as QMS hereinafter) 29 set on the inner wall surface of a process vessel 12 as a sensor for detecting the state of a plasma P generated in a process chamber 11. The QMS 29 detects the number of plasma ions reaching a predetermined region of the inner wall surface of the process vessel 12.

The detection result of the QMS 29 is output to a controller 36A. The controller 36A has the same function as that of the controller 36 shown in FIG. 1 except that it controls the reactance of a filter 27 on the basis of the detection result of the QMS 29 set on the inner wall surface of the process vessel 12.

When the first control mode appropriate for an etching process of a wafer W is selected, the controller 36A controls the reactance of the filter 27 in such a direction that the number of ions detected by the QMS 29, i.e., the number of ions reaching the inner wall surface of the process vessel 12, decreases. Then, the plasma P does not diffuse in the entire process chamber 11 but is distributed over a region opposing the support surface of a susceptor 21 at a high density. Thus, in the same manner as with the etching apparatus shown in FIG. 1, the etching process can be performed more efficiently than in the prior art, and the service life of the process vessel 512 can be prolonged.

When the second control mode appropriate for cleaning of the interior of the process chamber 11 is selected, the controller 36A controls the reactance of the filter 27 in such a direction that the number of ions detected by the QMS 29, i.e., the number of ions reaching the inner wall surface of the process chamber 11, decreases. Thus, the interior of the process chamber 11 can be cleaned efficiently.

In place of the QMS 29, a current sensor for detecting the value of a current flowing from the process vessel 12 to ground may be used. In this case, the controller may control the reactance of the filter 27 in such a direction that the current value detected by the current sensor decreases in the first mode, and in such a direction that the current value detected by the current sensor increases in the second mode.

In the etching apparatus shown in FIG. 1, the filter 27 is controlled on the basis of an electrical signal flowing from the susceptor 21 to ground, and in the etching apparatus shown in FIG. 5, the filter 27 is controlled on the basis of an electrical signal flowing from the process vessel 12 to ground. Alternatively, the two control schemes may be combined, and the filter 27 may be controlled optimally on the basis of the two electrical signals.

Third Embodiment

Figure 6:
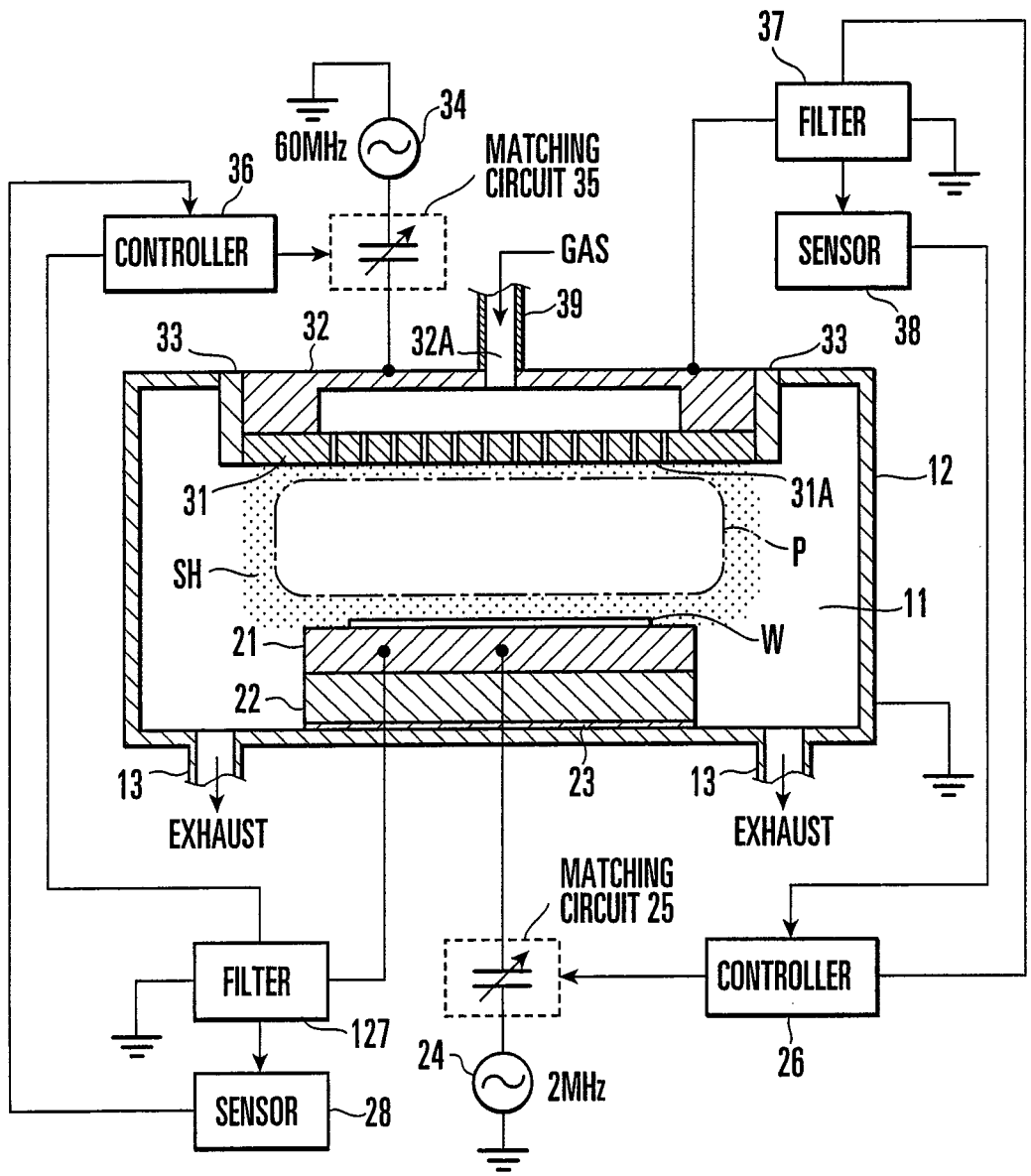
FIG. 6 is a view showing the arrangement of an etching apparatus according to the third embodiment of the present invention.

FIG. 6 is a view showing the arrangement of an etching apparatus according to the third embodiment of the present invention. In FIG. 6, the same portions as in FIG. 1 are denoted by the same reference numerals, and a description thereof will be omitted when appropriate.

The etching apparatus shown in FIG. 6 is a two-frequency type etching apparatus having, in addition to an RF power supply 34 which supplies an RF power for exciting a plasma P, an RF power supply 24 which supplies an RF power for applying a bias across an upper electrode 31 and susceptor 21. When the bias is applied across the upper electrode 31 and susceptor 21, etching can be performed while controlling the energy and anisotropy of the plasma P. The RF power supply 24 may suffice as far as it outputs an RF power with a frequency of about 100 kHz to 13 MHz and a power value of about 1.0 kW to 5.0 kW. In this embodiment, note that the RF power supply 24 outputs an RF power with a frequency of 2 MHz and a power value of 1.5 kW. When cleaning is to be performed, an output from the RF power supply 24 is stopped, or the RF power supply 24 outputs a low power of 100 W to 500 W.

The RF power supply 24 is connected to the susceptor 21 through a matching circuit 25. The matching circuit 25 matches the impedances of the RF power supply 24 and susceptor 21, and is formed of, e.g., a variable capacitor. The capacitor of the matching circuit 25 is controlled by a controller 26.

A support 32 having the same potential as that of the upper electrode 31 is grounded through a second filter 37 formed of a resonance circuit having a variable reactance. The path extending from the susceptor 21 to reach ground through the upper electrode 31, support 32, and filter 37 will be called the second path. When the reactance of the filter 37 is changed, the impedance of the second path against the frequency (2 MHz) of the RF power supplied to the susceptor 21 can be adjusted.

Furthermore, a sensor 38 which detects an electrical signal flowing through the filter 37 and a control means for controlling the reactance of the filter 37 on the basis of the detection result output from the sensor 38 are provided. In the etching apparatus shown in FIG. 6, the controller 26 for the matching circuit 25 is provided with the function of the control means for the filter 37.

Regarding the sensor 38 and controller 26, they have the same arrangements and the same functions as those of the sensor 28 and controller 36, respectively, shown in FIG. 1. Note that the controller 26 as the control means for the filter 37 suffices as far as it has the function of controlling the reactance of the filter 37 in such a direction that the impedance of the second path against the frequency of the RF power supplied to the susceptor 21 decreases.

The filter 37 will be further described.

Figure 7:
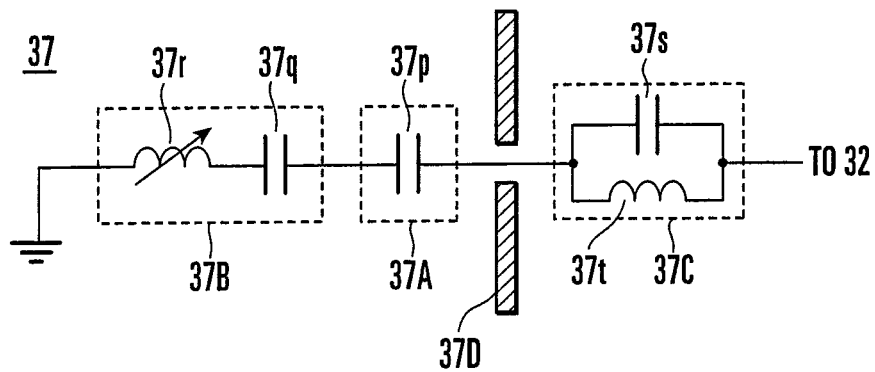
FIG. 7 is a circuit diagram showing the arrangement of a second filter.

FIG. 7 is a circuit diagram showing the arrangement of the filter 37. The filter 37 has a first module 37A for blocking a DC component from passing therethrough, a second module 37B with a variable reactance against the frequency of the RF power supplied to the susceptor 21, and a third module 37C for blocking the frequency (60 MHz) of the RF power supplied to the upper electrode 31 from passing therethrough.

When the RF power supply 24 supplies an RF power to the susceptor 21, a DC voltage of about several hundred V is generated in the upper electrode 31. The first module 37A is formed of, e.g., a capacitor 37p, and blocks the DC component from passing from the upper electrode 31 to ground, thus preventing short-circuiting of the DC component.

The second module 37B is formed of, e.g., a series circuit (LC series resonance circuit) of a coil 37r and capacitor 37q. In this case, it suffices as far as at least one of the inductance of the coil 37r and the capacitance of the capacitor 37q is variable. In this embodiment, the inductance of the coil 37r is variable, while the capacitance of the capacitor 37q is fixed. When the second module 37B is an LC series resonance circuit as shown in FIG. 7, the capacitor 37q of the second module 37B may also serve as the capacitor 37p of the first module 37A.

The third module 37C is formed of, e.g., a parallel circuit of a coil 37t and capacitor 37s, and is designed to have a high impedance against a frequency in the vicinity of the frequency (60 MHz) of the RF power to be supplied to the upper electrode 31. Thus, the RF power supplied to the upper electrode 31 can be prevented from flowing to the filter 37.

A blocking plate 37D made of aluminum or ion, which performs electrostatic blocking or electromagnetic blocking, is arranged between the first and second modules 37A and 37B and the third module 37C. When electrical interference occurs between the third module 37C and the first and second modules 37A and 37B, the band-blocking ability of the third module 37C decreases largely, and power loss due to the filter 37 occurs. Then, not only the power efficiency decreases, but depending on the case, an excessive current may also flow through the filter 37 to burn it. When the blocking plate 37D is provided, these problems can be prevented.

The reactance of the filter 37 having the above arrangement is designed such that under predetermined process conditions, a resonance frequency f2 of the second path becomes equal to the frequency (2 MHz) of the RF power supplied to the susceptor 21 and the impedance against this frequency becomes minimum. The range of the reactance is set such that even when an inductance $L_{SH}$ and capacitance $C_{SH}$ obtained by an ion sheath SH change in accordance with the process conditions, the impedance of the second path can be minimized. This is the same as in the filter 27 shown in FIG. 1.

For example, to obtain f2=2 MHz under the following process conditions, C=1,500 pF and 1 μH≤L≤50 μH are given.

RF power supplied to the upper electrode 31
frequency: 60 MHz, power value: 1.0 kW to 5.0 kW RF power supplied to the susceptor 21
frequency: 2 MHz, power value: 1.0 kW to 5.0 kW
process pressure: 0.6 Pa to 10 Pa
process gases: Ar=200 sccm to 400 sccm,
$O_2$=5 sccm to 20 sccm Alternatively, the filter 37 may be formed by using a fixed inductance L (e.g., 5 μH or more) sufficiently larger than the upper limit of the variable range of the inductance $L_{SH}$ obtained by the ion sheath SH, or a fixed capacitance C (e.g., 200 pF or less) sufficiently smaller than the lower limit of the variable range of the capacitance $C_{SH}$ obtained by the ion sheath SH.

In a filter 127, a third module (not shown) for blocking a frequency of 2 MHz is series-connected to the first and second modules 27A and 27B shown in FIG. 2, so the 2-MHz RF power supplied from the RF power supply 24 to the susceptor 21 does not flow to the filter 127 which is also connected to the susceptor 21. In this case, the reactance of the filter 127 is designed such that a resonance frequency f1 of the entire first path including the third module becomes equal to the frequency (60 MHz) of the RF power supplied to the upper electrode 31. When a blocking plate of aluminum or iron which performs electrostatic blocking or electromagnetic blocking is arranged between the first and second modules 27A and 27B and the third module, a decrease in power efficiency and burning can be prevented.

Figure 8:
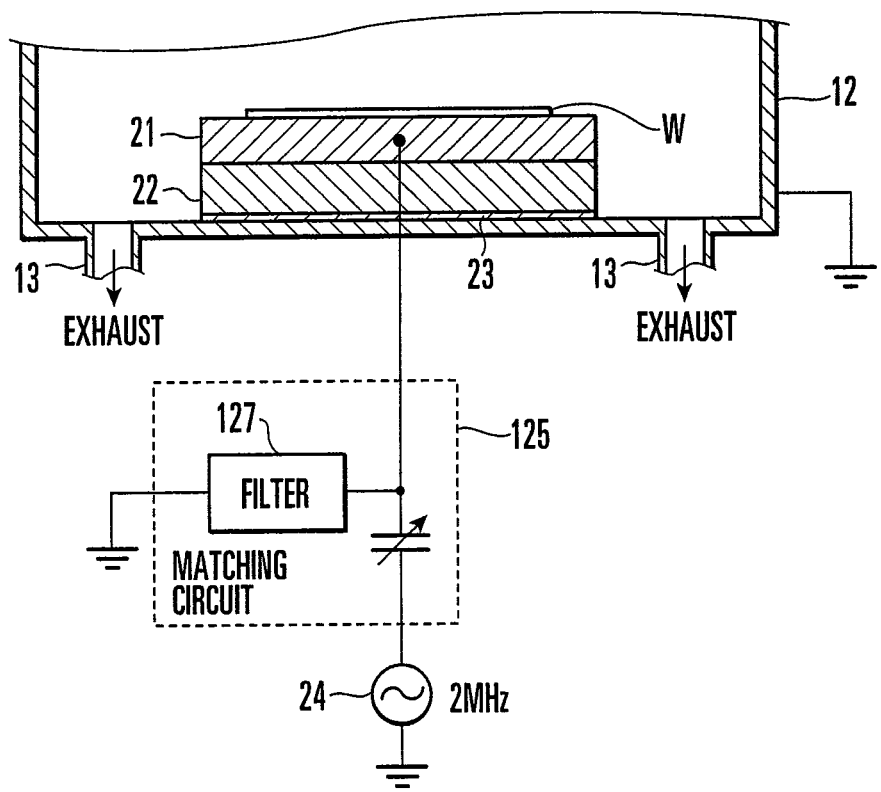
FIG. 8 is a view showing an arrangement in which the first filter and a matching circuit are integrally formed.
Figure 9:
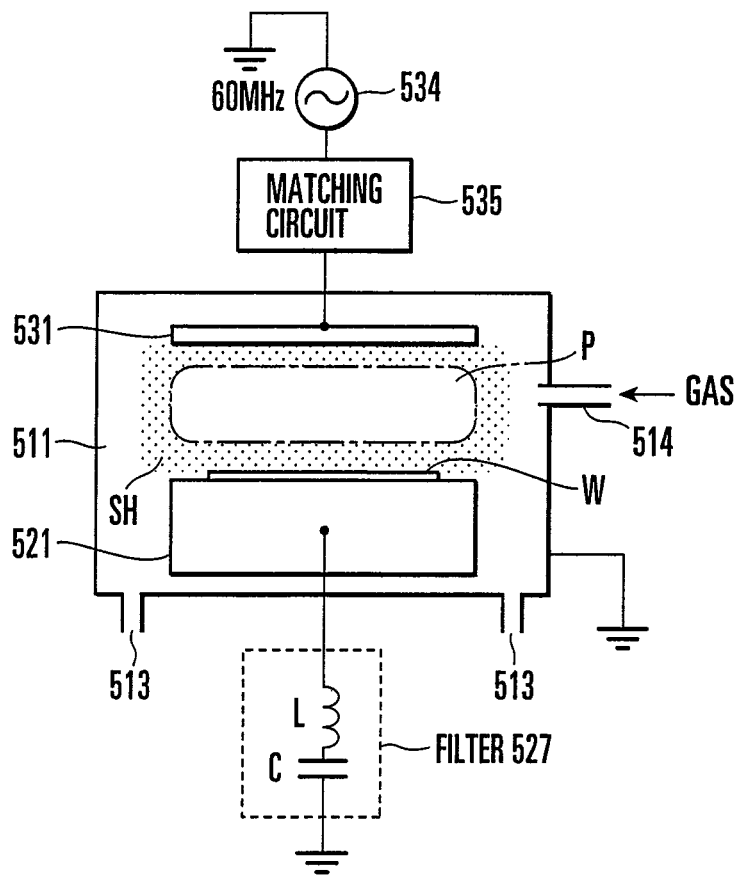
FIG. 9 is a view showing an arrangement of an etching apparatus using a conventional plasma processing apparatus.
Figure 10:
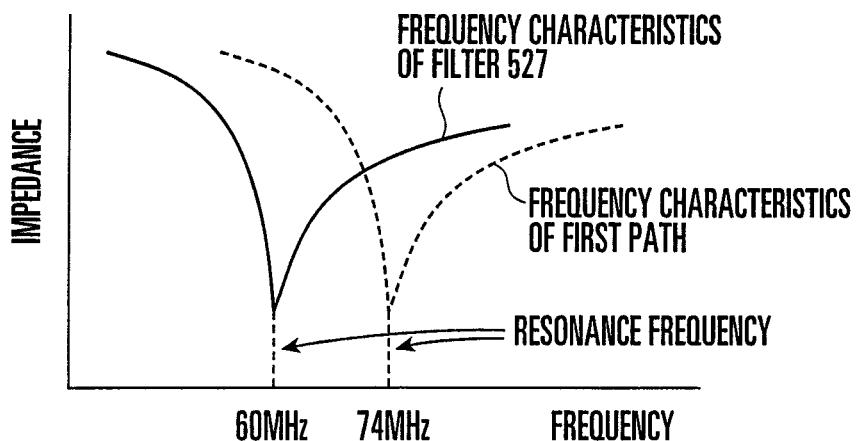
FIG. 10 is a graph showing the frequency characteristics of the filter used in the etching apparatus shown in FIG. 9, and the frequency characteristics of a path extending from the upper electrode to reach ground through a susceptor and filter.

Alternatively, a matching circuit 125 including a filter 127 may be used, as shown in FIG. 8.

The etching apparatus has the arrangement described above, and control operation is performed on the basis of a current flowing through the filter 37 in such a direction that the impedance of the entire second path against 2 MHz decreases. Then, of the RF power supplied to the susceptor 21, its proportion directed to the process vessel 12 decreases, while its proportion directed to the upper electrode 31 increases. Hence, the energy and anisotropy of the plasma P occurring upon application of a bias can be controlled more accurately than in the prior art. Even when the process conditions change and accordingly the state of the ion sheath SH changes, the energy and anisotropy of the plasma P can be controlled with the same accuracy.

The bias applied across the upper electrode 31 and susceptor 21 may be either a DC bias or pulsed bias. Hence, a DC power supply may be used in place of the RF power supply 24. As the sensor for detecting the state of the plasma P, a sensor set to the inner wall surface of the process vessel 12, like the QMS shown in FIG. 5, may be used.

Fourth Embodiment

The controller 36 shown in FIG. 1 may have a plurality of control modes that realize different plasma distributions in the process chamber 11, and a switch (not shown) for performing switching operation among these control modes.

For example, in a process that produces a large amount of deposits to attach to the inner wall surface of the process vessel 12, a control mode with which the amount of plasma P reaching the inner wall surface of the process vessel 12 increases is selected, and the reactance of the filter 27 is controlled. Then, deposits do not easily attach to the inner wall surface.

In a process that produces a small amount of deposits to attach to the inner wall surface of the process vessel 12, a control mode with which the amount of plasma P reaching the inner wall surface of the process vessel 12 becomes smaller than that described above is selected, and the reactance of the filter 27 is controlled. In this case, the amount of plasma P reaching the inner wall surface may be comparatively increased to such a degree that no deposit attaches to the inner wall surface at all, or may be comparatively decreased to such a degree that deposits stably attach to the inner wall surface.

Therefore, when the process conditions are changed, the control mode is switched in accordance with the characteristics of the process, and the amount of deposits to attach to the inner wall surface of the process vessel 12 is adjusted, so particles formed from peeled-off deposits can be decreased. Then, the yield of elements to be formed on the wafer W can be increased.

The controller 36 shown in FIG. 1 may have the function of changing the reactance of the filter 27 during the etching process.

For example, control operation may be performed by periodically changing the amount of plasma P to reach the inner wall surface of the process vessel 12 during the process, so the deposits attaching to the inner wall surface of the process vessel 12 stabilize.

The deposits that are to attach to the inner wall surface of the process vessel 12 do not attach easily if the temperature of the inner wall surface increases. In view of this, the temperature of the inner wall surface of the process vessel 12 may be measured, and the amount of plasma P to reach the inner wall surface may be changed during the process on the basis of the measured temperature, so that the deposits attach stably. Alternatively, the lapse time since the start of generation of the plasma P may be measured, and the same control operation may be performed on the basis of the measured time.

When the deposits attaching to the inner wall surface of the process vessel 12 are stabilized in the above manner, the deposits can be prevented from peeling off to form particles. This can improve the yield of the elements to be formed on the wafer W.

When the reactance of the filter 27 is changed during the etching process, the amount or nature of radicals to attach to the inner wall surface of the process vessel 12 can be changed. If the amount or nature of the radicals to attach to the inner wall surface changes, components or amount dissociating from the inner wall surface changes. If optimal radicals are selected, the process performance can be improved.

At the etching end point, the constitution of the radicals in the process chamber 11 changes, and the attaching easiness of the radicals to the inner wall surface or dissociating easiness of the radicals from the inner wall surface changes. Hence, as one of the process conditions, the reactance of the filter 27 may be changed, so the constitution of the radicals does not change at the etching end point.

The reactance of the filter 27 may be controlled by the controller 36 in accordance with a preset procedure, or on the basis of a detection signal such as an EPD (End Point Detection) signal indicating the etching end point.

The above function of the controller 36 may be provided to the controller 26 shown in FIG. 6 as a function for the filter 37.

Fifth Embodiment

The controller 36 shown in FIG. 1 may have the function of appropriately controlling the reactance of the filter 27 so that occurrence of abnormal discharge in the process chamber 11 is suppressed.

For example, the larger the value of the current flowing through the filter 27, the more unlikely abnormal discharge occurs. When the value of the current flowing through the filter 27 is detected by the current sensor 28A and the reactance of the filter 27 is controlled by the controller 36 in such a direction that the detected current value increases, thus maximizing the current value, then occurrence of abnormal discharge can be suppressed.

The reactance of the filter 27 may be controlled on the basis of the value of the voltage applied to the filter 27, in place of the value of the current flowing through the filter 27.

Whether the maximum value of the current flowing to the filter 27 and the like are adjusted to adjustment values that are effective for suppressing abnormal discharge can be checked from the detection result of the sensor 28.

This function of the controller 36 may be provided to the controller 26 shown in FIG. 6 as a function for the filter 37.

As has been described above, according to the above embodiments, a sensor for detecting the state of the plasma, and a control means for controlling the circuit characteristics of the first filter connected between the susceptor and ground in accordance with the detection result are provided. Thus, the impedance of the first path, which extends from an electric field generating means for generating an AC field at a position opposing the support surface of the susceptor to reach ground through the susceptor and filter, can be adjusted in accordance with the state of the plasma. A preferable plasma distribution in accordance with the object of the plasma process can be realized, so the process efficiency can be improved. Etching of the inner wall surface of the process chamber with the plasma can be suppressed, so the service life of the process chamber is prolonged, and occurrence of particles can be decreased.

While the above description exemplifies a parallel-plate etching apparatus, the present invention can also be applied to an induction-coupled plasma etching apparatus, microwave plasma etching apparatus, and the like. Naturally, the present invention can be applied not only to an etching apparatus but also to other plasma processing apparatuses such as a plasma CVD apparatus.

The invention claimed is:

1. A plasma processing apparatus comprising:
a lower electrode arranged in a hermetic process chamber and having a support surface for placing a target object thereon,
an upper electrode arranged in the hermetic process chamber and opposing the support surface of said lower electrode,
an RF power supply coupled to the lower electrode,
a first filter connected between said upper electrode and ground and having variable circuit characteristics,
a sensor provided on an upper electrode side and which detects at least one of a voltage impressed upon said first filter based on plasma generated in the process chamber and a current flowed to said first filter based on plasma generated in the process chamber, and
a controller operatively configured to control the circuit characteristics of said first filter on the basis of a detection result output from said sensor, such that when the reactance of the first filter is changed the impedance of a first path extending from the lower electrode to the ground through the upper electrode and the filter can be adjusted as per state of the plasma including changes in ion sheath reactance, wherein
said controller is configured to select a first control mode of maximizing the plasma distributed in a region opposing the support surface of said lower electrode and a second control mode of maximizing the plasma reaching an inner wall surface of said process chamber, in a multi-level manner or arbitrarily, and the controller is operatively configured to control the reactance of said first filter according to a resonance frequency of the first path.

2. A plasma processing apparatus according to claim 1, wherein said controller alternately selects from among a plurality of control modes, thus realizing a predetermined plasma distribution corresponding to each of the control modes in said process chamber.

3. A plasma processing apparatus according to claim 2, wherein said controller changes the circuit characteristics of said first filter during a process.

4. A plasma processing apparatus according to claim 1, wherein said sensor detects a value of the current flowing through said first filter, and said controller controls in such a direction that the value of the current increases if the first control mode is selected, and controls in such a direction that the value of the current decreases if the second control mode is selected.

5. A plasma processing apparatus according to claim 1, wherein said sensor detects a value of the voltage applied to said first filter, and said controller controls in such a direction that the value of the voltage decreases if the first control mode is selected, and controls in such a direction that the value of the voltage increases if the second control mode is selected.

6. A plasma processing apparatus according to claim 1, wherein said controller controls the circuit characteristics of said first filter when the first control mode is selected differently than when the second control mode is selected.

7. A plasma processing apparatus according to claim 1, wherein said controller controls the reactance of said first filter in combination with capacitance control of a matching circuit.

8. A plasma processing apparatus according to claim 1, wherein said controller appropriately controls the circuit characteristics of said first filter such that occurrence of abnormal discharge in said process chamber is suppressed.

9. A plasma processing apparatus according to claim 1, wherein said first filter has a first module for blocking a DC component from passing therethrough, and a second module with a variable circuit constant against a frequency of the AC electric field.

10. A plasma processing apparatus according to claim 1, wherein said first control mode is selected when an etching process is performed and said second control mode is selected when a cleaning process is performed.

11. A plasma processing apparatus according to claim 1, wherein said controller obtains a phase difference between the voltage and the current detected by said sensor and controls at least one of said variable circuit characteristics based on the phase difference obtained.

12. A plasma processing apparatus according to claim 1, wherein said controller obtains a power consumption value based on the voltage and the current detected by said sensor and controls the circuit characteristics of said first filter based on the power consumption value obtained.

13. A plasma processing apparatus comprising:
a lower electrode arranged in a hermetic process chamber and having a support surface for placing a target object thereon,
an upper electrode arranged in the hermetic process chamber and opposing the support surface of said lower electrode,
an RF power supply coupled to the lower electrode,
a first filter connected between the upper electrode and ground and having variable circuit characteristics,
a sensor provided on an upper electrode side and which detects at least one of a voltage impressed upon said first filter based on plasma generated in the process chamber and a current flowed to said first filter based on plasma generated in the process chamber, and
a controller operatively configured to control the circuit characteristics of said first filter on the basis of a detection result output from said sensor and to change the circuit characteristics of said first filter depending on whether the apparatus is in an etching process or a cleaning process, such that when the reactance of the first filter is changed the impedance of a first path extending from the lower electrode to the ground through the upper electrode and the filter can be adjusted as per state of the plasma including changes in ion sheath reactance, wherein
said first filter has a first module consisting of an electric element for blocking a DC component from passing therethrough, and a second module with a variable circuit constant against a frequency of an RF field,
said controller is configured to select a first control mode of maximizing the plasma distributed in a region opposing the support surface of said lower electrode and a second control mode of maximizing the plasma reaching an inner wall surface of said process chamber when the apparatus is respectively in the etching process and the cleaning process, and
the controller is operatively configured to control the reactance of said first filter according to a resonance frequency of the first path.

14. A plasma processing apparatus according to claim 13, wherein said controller alternately selects from among a plurality of control modes, thus realizing a predetermined plasma distribution corresponding to each of the control modes in said process chamber.

15. A plasma processing apparatus according to claim 14, wherein said sensor detects a value of the current flowing through said first filter, and said controller controls in such a direction that the value of the current increases if a first control mode is selected, and controls in such a direction that the value of the current decreases if a second control mode is selected.

16. A plasma processing apparatus according to claim 14, wherein said sensor detects a value of the voltage applied to said first filter, and said controller controls in such a direction that the value of the voltage decreases if a first control mode is selected, and controls in such a direction that the value of the voltage increases if a second control mode is selected.

17. A plasma processing apparatus according to claim 13, wherein said controller changes the circuit characteristics of said first filter during a process.

18. A plasma processing apparatus according to claim 13, wherein said controller controls the reactance of said first filter in combination with capacitance control of a matching circuit.

19. A plasma processing apparatus according to claim 13, wherein said controller appropriately controls the circuit characteristics of said first filter such that occurrence of abnormal discharge in said process chamber is suppressed.

* * * * *